United States Patent
Feinn et al.

(10) Patent No.: US 6,428,145 B1
(45) Date of Patent: Aug. 6, 2002

(54) WIDE-ARRAY INKJET PRINTHEAD ASSEMBLY WITH INTERNAL ELECTRICAL ROUTING SYSTEM

(75) Inventors: James A. Feinn, San Diego, CA (US); Michael J. Barbour, Corvallis, OR (US); Winthrop D. Childers, San Diego, CA (US); Melissa D. Boyd, Corvallis, OR (US)

(73) Assignee: Hewlett-Packard Company, Palo Alto, CA (US)

(*) Notice: Subject to any disclaimer, the term of this patent is extended or adjusted under 35 U.S.C. 154(b) by 201 days.

(21) Appl. No.: 09/648,565

(22) Filed: Aug. 25, 2000

Related U.S. Application Data

(63) Continuation-in-part of application No. 09/216,601, filed on Dec. 17, 1998, now Pat. No. 6,250,738, and a continuation-in-part of application No. 09/216,606, filed on Dec. 17, 1998.

(51) Int. Cl.[7] .................................................. B41J 2/14
(52) U.S. Cl. ............................ 347/50; 347/42; 347/13; 347/49
(58) Field of Search ............................ 347/50, 42, 59, 347/63, 12, 13, 65, 58

(56) References Cited

U.S. PATENT DOCUMENTS

| | | | |
|---|---|---|---|
| 4,463,359 A | 7/1984 | Ayata et al. | 347/56 |
| 5,016,023 A | 5/1991 | Chan et al. | 347/42 |
| 5,160,945 A | 11/1992 | Drake | 347/12 |
| 5,541,629 A | 7/1996 | Saunders et al. | 347/12 |
| 5,696,544 A | 12/1997 | Komuro | 347/50 |
| 5,719,605 A | 2/1998 | Anderson et al. | 347/59 |
| 5,742,305 A | 4/1998 | Hackleman | 347/42 |
| 5,755,024 A | 5/1998 | Drake et al. | 29/611 |
| 5,946,012 A | 8/1999 | Courian et al. | 347/63 |
| 6,113,214 A | * 9/2000 | Hirosawa et al. | 347/42 |
| 6,315,390 B1 | * 11/2001 | Fujii et al. | 347/42 |

OTHER PUBLICATIONS

Allen, R., "Ink Jet Printing with Large Pagewide Arrays: Issues and Challenges", Recent Progress in Ink Jet Technologies II, pp. 114–120.

* cited by examiner

Primary Examiner—Lamson D. Nguyen

(57) ABSTRACT

A wide-array inkjet printhead assembly includes a carrier and a plurality of printhead dies mounted on the carrier. The carrier includes a plurality of conductive layers, a plurality of conductive vias, and a plurality of insulative layers. The conductive layers include a first interface layer disposed on a first face of the carrier, a second interface layer disposed on a second face of the carrier, and at least one power layer, data layer, and ground layer each interposed between the first and second interface layers. Each conductive via provides a conductive path through at least one of the insulative layers to provide electrical coupling between selected ones of the conductive layers, and each of the printhead dies are electrically coupled to the first interface layer.

56 Claims, 5 Drawing Sheets

WIDE-ARRAY INKJET PRINTHEAD ASSEMBLY WITH INTERNAL ELECTRICAL ROUTING SYSTEM

CROSS-REFERENCE TO RELATED APPLICATIONS

This application is a Continuation-in-Part of U.S. patent application Ser. No. 09/216,601, entitled "Inkjet Printing Apparatus with Ink Manifold" filed on Dec. 17, 1998, now U.S. Pat. No. 6,250,738 and a Continuation-in-Part of U.S. patent application Ser. No. 09/216,606, entitled "Multilayered Ceramic Substrate Serving as Ink Manifold and Electrical Interconnection Platform for Multiple Printhead Dies" filed on Dec. 17, 1998, both assigned to the assignee of the present invention, and incorporated herein by reference. This application is related to U.S. patent application Ser. No. 08/959,376, entitled "Scalable Wide-Array Inkjet Printhead and Method for Fabricating Same" filed on Oct. 28, 1997, entitled "Wide-Array Inkjet Printhead Assembly Having Planarized Mounting Layer for Printhead Dies" filed on even date herewith, both assigned to the assignee of the present invention, and incorporated herein by reference.

THE FIELD OF THE INVENTION

The present invention relates generally to inkjet printheads, and more particularly to a wide-array inkjet printhead assembly.

BACKGROUND OF THE INVENTION

A conventional inkjet printing system includes a printhead, an ink supply which supplies liquid ink to the printhead, and an electronic controller which controls the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single carrier. As such, a number of nozzles and, therefore, an overall number of ink drops which can be ejected per second is increased. Since the overall number of drops which can be ejected per second is increased, printing speed can be increased with the wide-array inkjet printing system.

Mounting a plurality of printhead dies on a single carrier, however, requires a plurality of power, ground, and data lines for the printhead dies. As such, the single carrier must accommodate a plurality of electrical connections between the electronic controller and each of the printhead dies. In addition, a conventional inkjet printing system typically includes electrical interfaces in the form of conductive traces on a polyimide circuit. Since polyimides will absorb water, a conventional inkjet printing system which is subjected to a warm, humid environment is prone to trace corrosion. Furthermore, a leading cause of electrical shorts in a conventional inkjet printing system is interfacial separation caused by ink ingression at electrical interfaces of the polyimide circuit.

Accordingly, a need exists for routing power, ground, and data lines between an electronic controller and a plurality of printhead dies mounted on a single carrier. In addition, a need exists for eliminating electrical interfaces which are prone to corrosion and ink ingression.

SUMMARY OF THE INVENTION

One aspect of the present invention provides an inkjet printhead assembly. The inkjet printhead assembly includes a carrier and a plurality of printhead dies each mounted on a first face of the carrier. The carrier includes a plurality of conductive layers, a plurality of conductive vias, and a plurality of insulative layers, wherein the plurality of conductive layers include a first interface layer disposed on the first face of the carrier, a second interface layer disposed on a second face of the carrier, and at least one power layer, at least one data layer, and at least one ground layer each interposed between the first interface layer and the second interface layer. Each conductive via provides a conductive path through at least one of the insulative layers to provide electrical coupling between selected ones of the conductive layers, and each of the printhead dies are electrically coupled to the first interface layer.

In one embodiment, the carrier has a plurality of ink passages extending therethrough. As such, at least one of the ink passages communicates with the first face of the carrier and at least one of the printhead dies to provide ink to the printhead dies.

In one embodiment, each of the insulative layers is interposed between two of the conductive layers. In one embodiment, at least one of the insulative layers is interposed between the first interface layer and at least one of the at least one power layer, the at least one data layer, and the at least one ground layer. In one embodiment, at least one of the insulative layers is interposed between the second interface layer and at least one of the at least one power layer, the at least one data layer, and the at least one ground layer. In one embodiment, the at least one ground layer is interposed between the at least one data layer and the second interface layer.

In one embodiment, the at least one data layer includes at least one print data layer and at least one non-print data layer. In one embodiment, the at least one ground layer is interposed between the at least one non-print data layer and the second interface layer. In one embodiment, the at least one ground layer is interposed between the at least one print data layer and the at least one non-print data layer. In one embodiment, the at least one power layer and the at least one ground layer are disposed in one plane. In one embodiment, the at least one data layer carries at least one of print data and non-print data.

In one embodiment, the second face of the carrier is opposed to the first face of the carrier. In one embodiment, at least one of the insulative layers comprises a ceramic material.

Another aspect of the present invention provides a method of forming an inkjet printhead assembly. The method includes providing a plurality of conductive layers including a first interface layer, a second interface layer, at least one power layer, at least one data layer, and at least one ground layer, providing a plurality of insulative layers, and providing a plurality of conductive paths through at least one of the insulative layers to provide electrical coupling between selected ones of the conductive layers. As such, the method includes disposing the first interface layer on a first side of a first of the insulative layers and disposing the second interface layer on a second side of a second of the insulative layers, and interposing the at least one power layer, the at least one data layer, and the at least one ground layer between the first of the interface layers and the second of the interface layers. The method also includes mounting a plurality of printhead dies on and electrically coupling the printhead dies to the first interface layer.

Another aspect of the present invention provides a carrier adapted to receive a plurality of printhead dies. The carrier includes a first interface adapted for electrical communication with the printhead dies, at least one power layer for conducting power, at least one data layer for carrying data, a second interface, a plurality of insulative layers, and a plurality of conductive vias. The insulative layers include at least one insulative layer interposed between the at least one power layer and the at least one data layer. Each of the conductive vias provide a conductive path through at least one of the insulative layers to provide electrical coupling between selected ones of the first interface, the at least one power layer, the at least one data layer, and the second interface.

Another aspect of the present invention provides a method of forming a carrier for a plurality of printhead dies. The method includes providing a first interface adapted for electrical communication with the printhead dies, providing at least one power layer for conducting power, providing at least one data layer for carrying data, providing a second interface, interposing at least one insulative layer between the at least one power layer and the at least one data layer, and providing a conductive path through the at least one insulative layer to provide electrical coupling between selected ones of the first interface, the at least one power layer, the at least one data layer, and the second interface.

The present invention provides a three-dimensional, internal electrical routing scheme which facilitates the routing of power, ground, and data lines between an electronic controller and a plurality of printhead dies each mounted on a single carrier.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. The inkjet printhead assembly and related components of the present invention can be positioned in a number of different orientations. As such, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
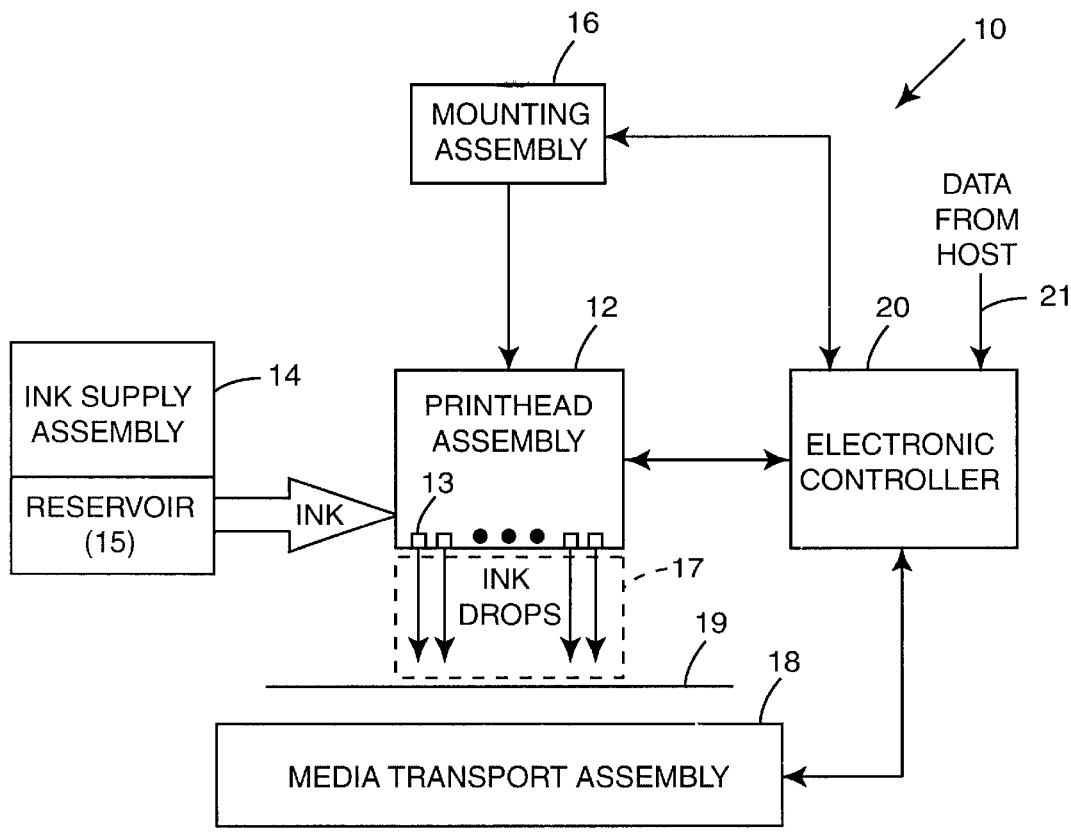
FIG. 1 is a block diagram illustrating one embodiment of an inkjet printing system according to the present invention.

FIG. 1 illustrates one embodiment of an inkjet printing system 10 according to the present invention. Inkjet printing system 10 includes an inkjet printhead assembly 12, an ink supply assembly 14, a mounting assembly 16, a media transport assembly 18, and an electronic controller 20. Inkjet printhead assembly 12 is formed according to an embodiment of the present invention, and includes one or more printheads which eject drops of ink through a plurality of orifices or nozzles 13 and toward a print medium 19 so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes characters, symbols, and/or other graphics or images to be printed upon print medium 19 as inkjet printhead assembly 12 and print medium 19 are moved relative to each other.

Ink supply assembly 14 supplies ink to printhead assembly 12 and includes a reservoir 15 for storing ink. As such, ink flows from reservoir 15 to inkjet printhead assembly 12. Ink supply assembly 14 and inkjet printhead assembly 12 can form either a one-way ink delivery system or a recirculating ink delivery system. In a one-way ink delivery system, substantially all of the ink supplied to inkjet printhead assembly 12 is consumed during printing. In a recirculating ink delivery system, however, only a portion of the ink supplied to printhead assembly 12 is consumed during printing. As such, ink not consumed during printing is returned to ink supply assembly 14.

In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube. In either embodiment, reservoir 15 of ink supply assembly 14 may be removed, replaced, and/or refilled. In one embodiment, where inkjet printhead assembly 12 and ink supply assembly 14 are housed together in an inkjet cartridge, reservoir 15 includes a local reservoir located within the cartridge as well as a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly. As such, mounting assembly 16 includes a carriage for moving inkjet printhead assembly 12 relative to media transport assembly 18 to scan print medium 19. In another embodiment, inkjet printhead assembly 12 is a non-scanning type printhead assembly. As such, mounting assembly 16 fixes inkjet printhead assembly 12 at a prescribed position relative to media transport assembly 18. Thus, media transport assembly 18 positions print medium 19 relative to inkjet printhead assembly 12.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops, is determined by the print job commands and/or command parameters. In one embodiment, logic and drive circuitry forming a portion of electronic controller 20 is incorporated in an integrated circuit (IC) 22 located on inkjet printhead assembly 12 (shown in FIG. 5). In another embodiment, logic and drive circuitry is located off inkjet printhead assembly 12.

Figure 2:
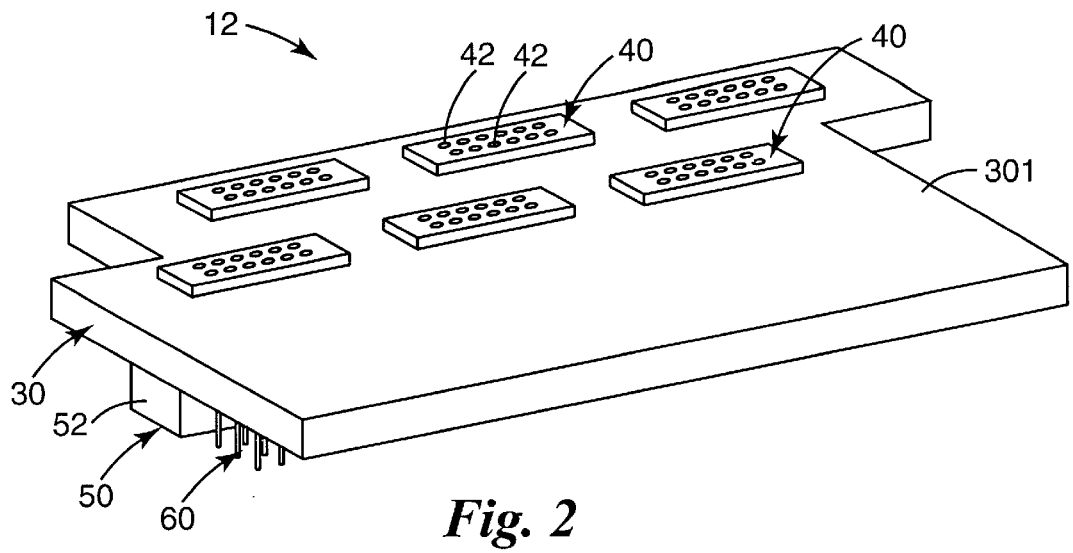
FIG. 2 is a top perspective view of an inkjet printhead assembly including a plurality of printhead dies according to the present invention.
Figure 3:
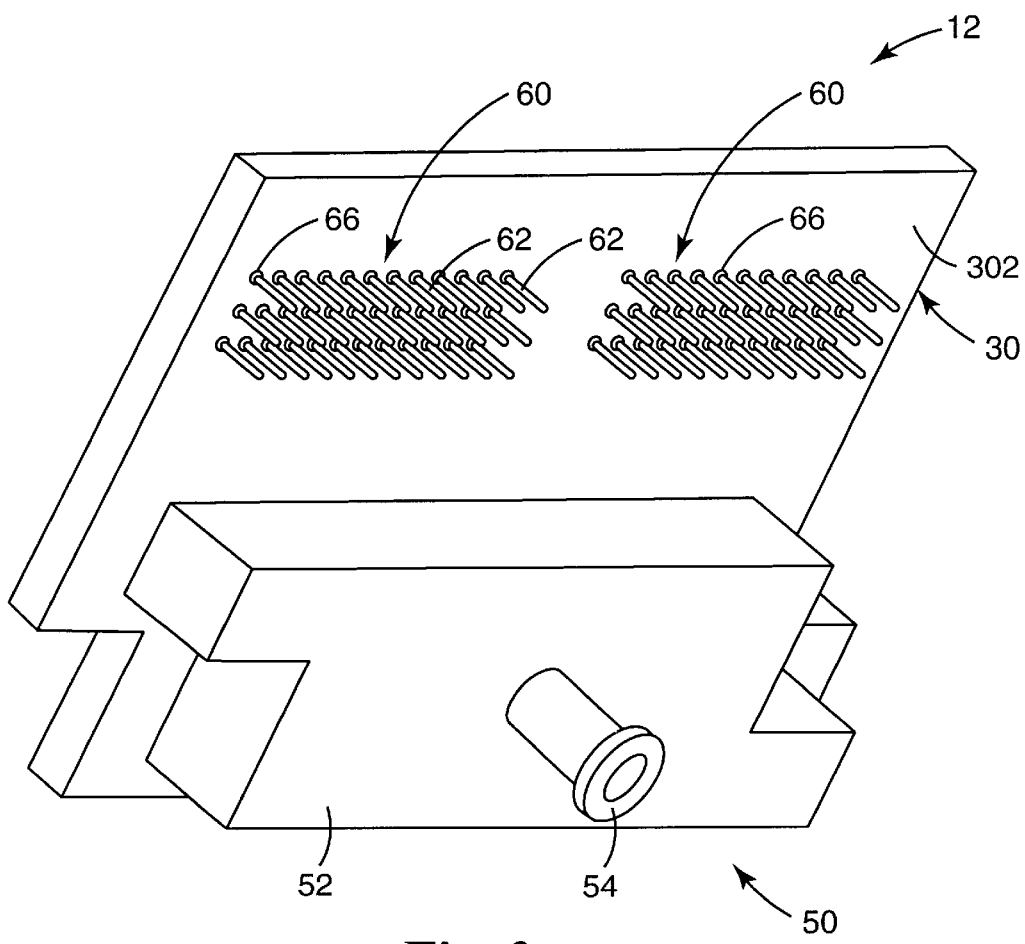
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 has an exposed surface or first face 301 and an exposed surface or second face 302 which is opposed to and oriented substantially parallel to first face 301. Carrier 30 serves to carry printhead dies 40 and provide electrical and fluidic communication between printhead dies 40, ink supply assembly 14, and electronic controller 20.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, inkjet printhead assembly 12 may span a nominal page width or a width shorter or longer than nominal page width. In one embodiment, a plurality of inkjet printhead assemblies 12 are mounted in an end-to-end manner. Carrier 30, therefore, has a staggered or stair-step profile. Thus, at least one printhead die 40 of one inkjet printhead assembly 12 overlaps at least one printhead die 40 of an adjacent inkjet printhead assembly 12. While six printhead dies 40 are illustrated as being mounted on carrier 30, the number of printhead dies 40 mounted on carrier 30 may vary.

Ink delivery system 50 fluidically couples ink supply assembly 14 with printhead dies 40. In one embodiment, ink delivery system 50 includes a manifold 52 and a port 54. Manifold 52 is mounted on second face 302 of carrier 30 and distributes ink through carrier 30 to each printhead die 40. Port 54 communicates with manifold 52 and provides an inlet for ink supplied by ink supply assembly 14.

Electronic interface system 60 electrically couples electronic controller 20 with printhead dies 40. In one embodiment, electronic interface system 60 includes a plurality of electrical or input/output (I/O) contacts 62. I/O contacts 62 are provided on second face 302 of carrier 30 and communicate electrical signals between electronic controller 20 and printhead dies 40 through carrier 30. Examples of I/O contacts 62 include I/O pins which engage corresponding I/O receptacles electrically coupled to electric controller 20 and I/O contact pads which contact corresponding electrical nodes electrically coupled to electronic controller 20.

Figure 4:
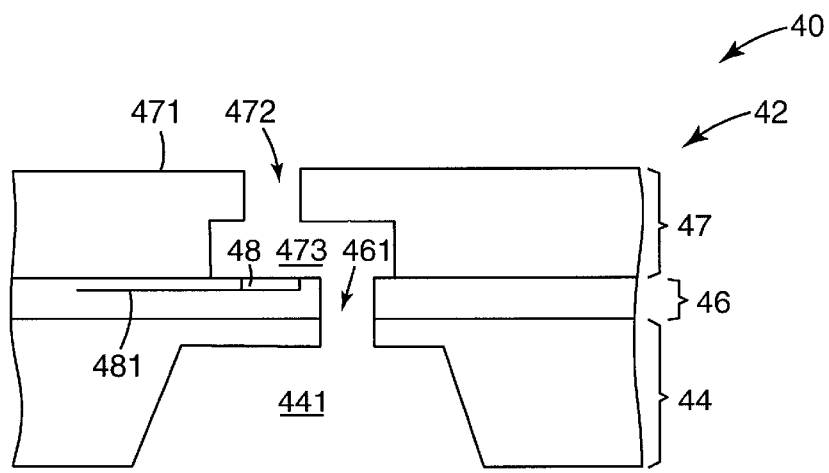
FIG. 4 is a cross-sectional view illustrating portions of a printhead die according to the present invention.

As illustrated in FIGS. 2 and 4, each printhead die 40 includes an array of printing or drop ejecting elements 42. Printing elements 42 are formed on a substrate 44 which has an ink feed slot 441 formed therein. As such, ink feed slot 441 provides a supply of liquid ink to printing elements 42. Each printing element 42 includes a thin-film structure 46, an orifice layer 47, and a firing resistor 48. Thin-film structure 46 has an ink feed channel 461 formed therein which communicates with ink feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and ink feed channel 461 of thin-film structure 46. Firing resistor 48 is positioned within nozzle chamber 473 and includes leads 481 which electrically couple firing resistor 48 to a drive signal and ground.

During printing, ink flows from ink feed slot 441 to nozzle chamber 473 via ink feed channel 461. Nozzle opening 472 is operatively associated with firing resistor 48 such that droplets of ink within nozzle chamber 473 are ejected through nozzle opening 472 (e.g., normal to the plane of firing resistor 48) and toward a print medium upon energization of firing resistor 48.

Example embodiments of printhead dies 40 include a thermal printhead, a piezoelectric printhead, a flex-tensional printhead, or any other type of inkjet ejection device known in the art. In one embodiment, printhead dies 40 are fully integrated thermal inkjet printheads. As such, substrate 44 is formed, for example, of silicon, glass, or a stable polymer and thin-film structure 46 is formed by one or more passivation or insulation layers of silicon dioxide, silicon carbide, silicon nitride, tantalum, poly-silicon glass, or other suitable material. Thin-film structure 46 also includes a conductive layer which defines firing resistor 48 and leads 481. The conductive layer is formed, for example, by aluminum, gold, tantalum, tantalum-aluminum, or other metal or metal alloy.

Figure 5:
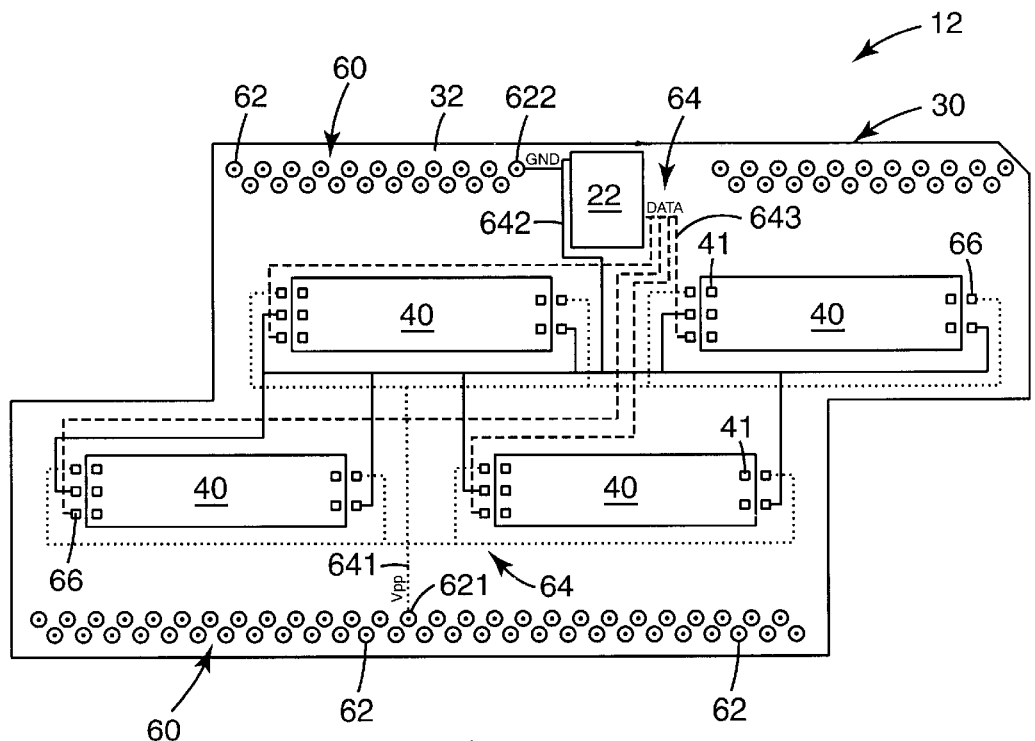
FIG. 5 is a schematic illustration of an inkjet printhead assembly according to the present invention.
Figure 6:
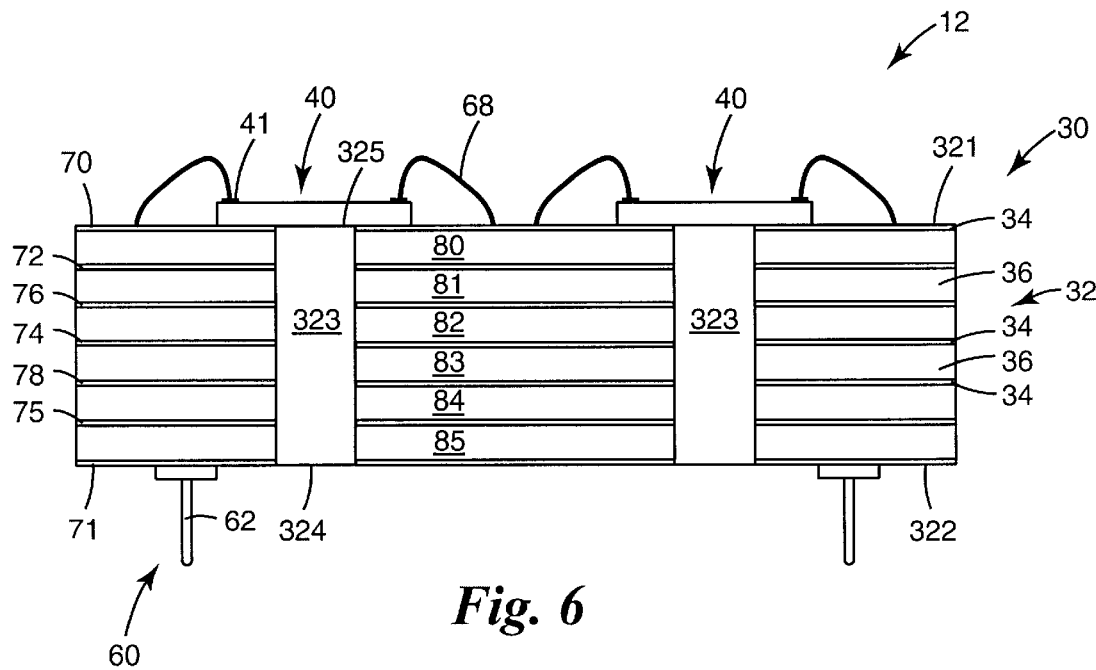
FIG. 6 is a schematic cross-sectional view of one embodiment of a portion of an inkjet printhead assembly according to the present invention.

Referring to FIGS. 5 and 6, carrier 30 is formed of a substrate 32 which is generally rectangular in cross-section. Substrate 32 has an exposed surface or top face 321 and an exposed surface or bottom face 322 which is opposed to and oriented substantially parallel to top face 321. In one embodiment, substrate 32 provides electrical interconnection among printhead dies 40, electrical interconnection between printhead dies 40 and electronic controller 20 via electronic interface system 60, and fluidic communication between ink supply assembly 14 and printhead dies 40 via ink delivery system 50.

For transferring electrical signals between electronic controller 20 and printhead dies 40, substrate 32 has a plurality of conductive paths 64 extending therethrough. More specifically, conductive paths 64 pass through substrate 32 and terminate at exposed surfaces of substrate 32. In one embodiment, conductive paths 64 include electrical contacts 66 at terminal ends thereof which form I/O bond pads on substrate 32. Thus, electrical contacts 66 provide a point for electrical connection to substrate 32 via, for example, I/O contacts 62, such as I/O pins or I/O contact pads, wire bond leads 68, electrical nodes (not shown), and/or other suitable electrical connectors. As such, conductive paths 64 provide electrical coupling between I/O contacts 62 and electrical contacts 66. In one embodiment, printhead dies 40 include electrical contacts 41 which form I/O bond pads. As such, conductive paths 64 include electrical connectors, for example, wire bond leads 68, which electrically couple electrical contacts 66 with electrical contacts 41 of printhead dies 40.

As illustrated in FIG. 5, conductive paths 64 extend between I/O contacts 62 and printhead dies 40, as well as integrated circuit 22 and printhead dies 40. As such, conductive paths 64 define transfer paths for power, ground, and data among and between printhead dies 40. Data includes, for example, print data and non-print data for printhead dies 40.

In one embodiment, conductive paths 64 include a power path 641, a ground path 642, and a data path 643. Power path 641 extends between at least one I/O contact 621 and printhead dies 40, and ground path 642 extends between at least one I/O contact 622 and printhead dies 40. As such, power path 641 provides power to printhead dies 40 for operation thereof and ground path 642 establishes a ground for printhead dies 40.

In one embodiment, electronic controller 20 includes integrated circuit (IC) 22 which is mounted on substrate 32. IC 22 includes logic and drive circuitry for inkjet printhead assembly 12 and, more specifically, printhead dies 40. Ground path 642, therefore, also extends between I/O contact 622 and IC 22 to establish a ground for IC 22. In addition, data path 643 extends between IC 22 and printhead dies 40.

Data path 643 transfers data between IC 22 and printhead dies 40. In one embodiment, data includes print data and non-print data. Print data includes, for example, nozzle data containing pixel information such as bitmap print data. Non-print data includes, for example, command/status (CS) data, clock data, and/or synchronization data. Status data of CS data includes, for example, printhead temperature or position, print resolution, and/or error notification.

In one embodiment, conductive paths 64 terminate at top face 321 and bottom face 322 of substrate 32. Thus, electrical contacts 66 are provided on top face 321 and bottom face 322 of substrate 32. As such, a number of I/O contacts 62 in the form of I/O pins are electrically coupled at one end to electrical contacts 66 provided on bottom face 322 and wire bond leads 68 are electrically coupled at one end to electrical contacts 66 on top face 321 and at another end to electrical contacts 41 of printhead dies 40.

While conductive paths 64 terminate at top face 321 and bottom face 322 of substrate 32, it is, however, within the scope of the present invention for conductive paths 64 to terminate at side faces of substrate 32. In addition, one or more conductive paths 64 may branch from or lead to one or more other conductive paths 64. Furthermore, one or more conductive paths 64 may begin and end within substrate 32.

FIG. 6 illustrates one embodiment of substrate 32. Substrate 32 is formed of multiple layers including a plurality of conductive layers 34 and a plurality of insulative layers 36. Each insulative layer 36 is interposed between two conductive layers 34. Conductive layers 34 include an interface layer 70, an interface layer 71, a power layer 72, a ground layer 74, a ground layer 75, a print data layer 76, and a non-print data layer 78. Insulative layers 36 include an insulative layer 80, an insulative layer 81, an insulative layer 82, an insulative layer 83, an insulative layer 84, and an insulative layer 85.

Interface layers 70 and 71 provide an input/output interface for communication with printhead dies 40 and electronic controller 20, respectively. Power layer 72, ground layers 74 and 75, print data layer 76, and non-print data layer 78 are each interposed between interface layers 70 and 71. Power layer 72 conducts power for printhead dies 40, ground layers 74 and 75 provide grounding for printhead dies 40, print data layer 76 carries print data for printhead dies 40, and non-print data layer 78 carries non-print data for printhead dies 40. The number of conductive layers 34 and insulative layers 36 can vary depending on the number of printhead dies 40 to be mounted on substrate 32 as well as the power and data rate requirements of printhead dies 40.

In one embodiment, interface layers 70 and 71 include, for example, electrical contacts 66 which provide points for electrical connection to conductive paths 64. Electrical connection is established, for example, via I/O contacts 62, such as I/O pins, contact pads, wire bonds, and/or other suitable electrical connectors. Conductive paths 64, therefore, terminate at and provide electrical coupling between electrical contacts 66. Thus, electrical contacts 66 disposed on top face 321 and bottom face 322 of substrate 32 define interface layer 70 and interface layer 71, respectively. It is also within the scope of the present invention for power and/or ground layers to constitute interface layers 70 and/or 71. As such, I/O contacts 62, for example, are directly coupled to power and/or ground layers.

In one embodiment, power layer 72, ground layers 74 and 75, and print data layer 76 and non-print data layer 78 form a portion of conductive paths 64 and, more specifically, power path 641, ground path 642, and data path 643, respectively. Thus, power layer 72, ground layers 74 and 75, print data layer 76, and non-print data layer 78 are each electrically coupled to interface layers 70 and 71. As such, power, ground, print data, and non-print data, are communicated between interface layers 70 and 71.

In one embodiment, as illustrated in FIG. 6, interface layer 70 is provided on a top side of insulative layer 80. As such, interface layer 70 provides an I/O interface for printhead dies 40. Power layer 72 is interposed between insulative layer 80 and insulative layer 81. Print data layer 76 is interposed between insulative layer 81 and insulative layer 82. Ground layer 74 is interposed between insulative layer 82 and insulative layer 83. Non-print data layer 78 is interposed between insulative layer 8 3 and insulative layer 84. Ground layer 75 is interposed between insulative layer 84 and insulative layer 85. Interface layer 71 is provided on a bottom side of insulative layer 85. As such, interface layer 71 provides an I/O interface for electronic controller 20. Thus, ground layers 74 and 75 are both interposed between print data layer 76 and interface layer 71. In addition, ground layer 74 is interposed between print data layer 76 and non-print data layer 78, and ground layer 75 is interposed between non-print data layer 78 and interface layer 71. By interposing ground layer 74 between, for example, print data layer 76 and non-print data layer 78, interference and, more specifically, electromagnetic induction (EMI) between high frequency print data and low frequency non-print data is controlled.

For transferring ink between ink supply assembly 14 and printhead dies 40, substrate 32 has a plurality of ink passages 323 formed therein. Ink passages 323 extend through substrate 32 and provide through-channels or through-openings for delivery of ink to printhead dies 40 from manifold 52.

Thus, ink passages 323 communicate at a first end 324 with manifold 52 of ink delivery system 50 and at a second end 325 with printhead dies 40. More specifically, second end 325 of ink passages 323 communicates with ink feed slot 441 of substrate 44 (shown in FIG. 4). As such, ink passages 323 form a portion of ink delivery system 50. Although only one ink passage 323 is shown for a given printhead die 40, there may be additional ink passages to the same printhead die to provide ink of respective differing colors.

In one embodiment, substrate 32 is formed of a ceramic, silicon, or suitable non-metallic material. Preferably, substrate 32 has a coefficient of thermal expansion approximating that of silicon, is able to receive solder and interconnect layers, and is able to receive mounting of integrated circuits. In addition, substrate 32 includes circuit patterns which extend along and pierce insulative layers 36 to form conductive paths 64. In one fabrication methodology, circuit patterns are formed in layers of unfired tape (referred to as green sheet layers) using a screen printing process. The green sheet layers are made of ceramic particles in a polymer binder. Alumina may be used for the particles, although other oxides or various glass/ceramic blends may be used. Each green sheet layer receives conductor lines and other metallization patterns as needed to form conductive paths 64. Such lines and patterns are formed with a refractory metal, such as tungsten, by screen printing on the corresponding green sheet layer. Thus, metallized or conductive layers 34 and non-conductive or insulative layers 36 are formed in substrate 32.

Figure 7:
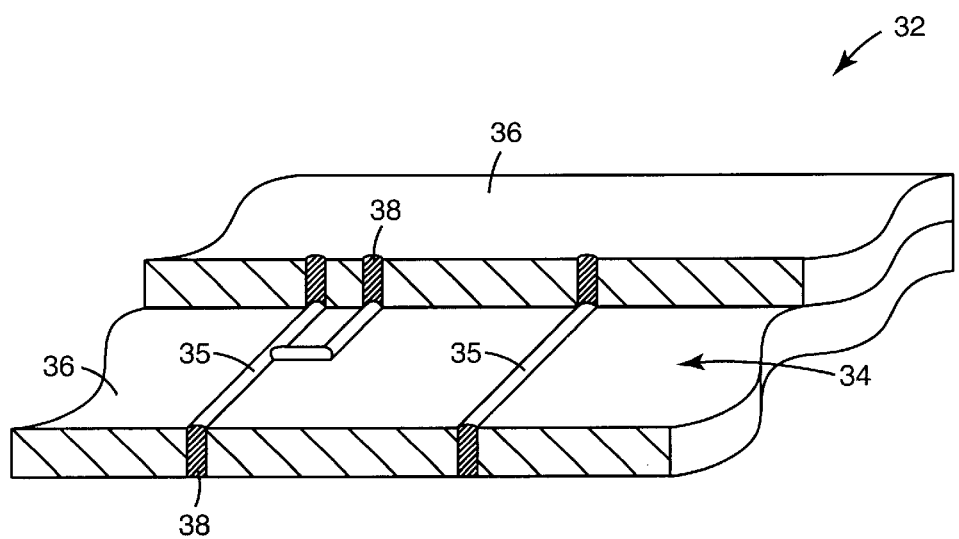
FIG. 7 is a cross-sectional top perspective view of a portion of the inkjet printhead assembly of FIG. 6.

As illustrated in FIG. 7, conductive layers 34 are defined by patterned sets of conductive traces 35 on insulative layers 36. Conductive traces 35 are formed on insulative layers 36 and constitute a portion of conductive paths 64. In one embodiment, substrate 32 includes a plurality of conductive vias 38 which pierce insulative layers 36 to provide conductive paths through insulative layers 36 and selectively join conductive traces 35 formed by conductive layers 34. Thus, conductive paths 64 extend from one layer to the next through via holes punched out from the green sheet and filled in, for example, with a tungsten paste to form conductive vias 38. As such, circuit patterns including conductive traces 35 and conductive vias 38 are formed in substrate 32. Openings in substrate 32, such as ink passages 323, are formed by punching holes and cavities of desired size and shape through the green sheet.

In one embodiment, at least two conductive layers 34 are formed in one plane. Power and ground layers and/or print data and non-print data layers, for example, may be formed on the same insulative layer. More specifically, two sets of conductive traces 35 are formed on one insulative layer 36, as illustrated, for example, in FIG. 7. Conductive traces 35, therefore, are coplanar. As such, conductive layers 34 are also coplanar.

Once each insulative layer 36 has received the desired conductive traces 35, conductive vias 38, and openings, insulative layers 36 are stacked in the desired configuration and joined together. In one embodiment, substrate 32, including conductive layers 34 and insulative layers 36, is laminated under pressure and then fired or cosintered so as to create a monolithic structure having a three dimensional electrical and fluidic routing system therein. Thereafter, printhead dies 40 are mounted on top face 321 of substrate 32 and electrical connectors, such as I/O contacts 62 and/or wire bond leads 68, are joined to electrical contacts 66. A number of electrical contacts 66 may provide contact points for electrical nodes (not shown) and, as such, may not include electrical connectors. Metal parts, such as I/O pins, are attached to electrical contacts 66 with a molten brazing process, for example, silver-copper eutectic brazing or a pure silver brazing. It is also within the scope of the present invention for conductive layers 34 and insulative layers 36 to be joined together with an adhesive or other suitable bonding agent.

It is to be understood that FIGS. 5–7 are simplified schematic illustrations of carrier 30. The illustrative routing of conductive paths 64 and ink passages 323 through substrate 32, for example, has been simplified for clarity of the invention. Although various features of carrier 30, such as conductive paths 64 and ink passages 323, are schematically illustrated as being straight, it is understood that design constraints could make the actual geometry more complicated for a commercial embodiment of printhead assembly 12. Ink passages 323, for example, may have more complicated geometries to allow multiple colorants of ink to be channeled through carrier 30. In addition, conductive paths 64 may have more complicated routing geometries through substrate 32 to avoid contact with ink passages 323 and to allow for electrical connector geometries different than the illustrated I/O pins. It is understood that such alternatives are within the scope of the present invention. Furthermore, printhead dies 40 are not mounted on conductive layer 34, but rather are actually mounted on first face 301 of carrier 30, as illustrated, for example, in FIG. 2.

Figure 8:
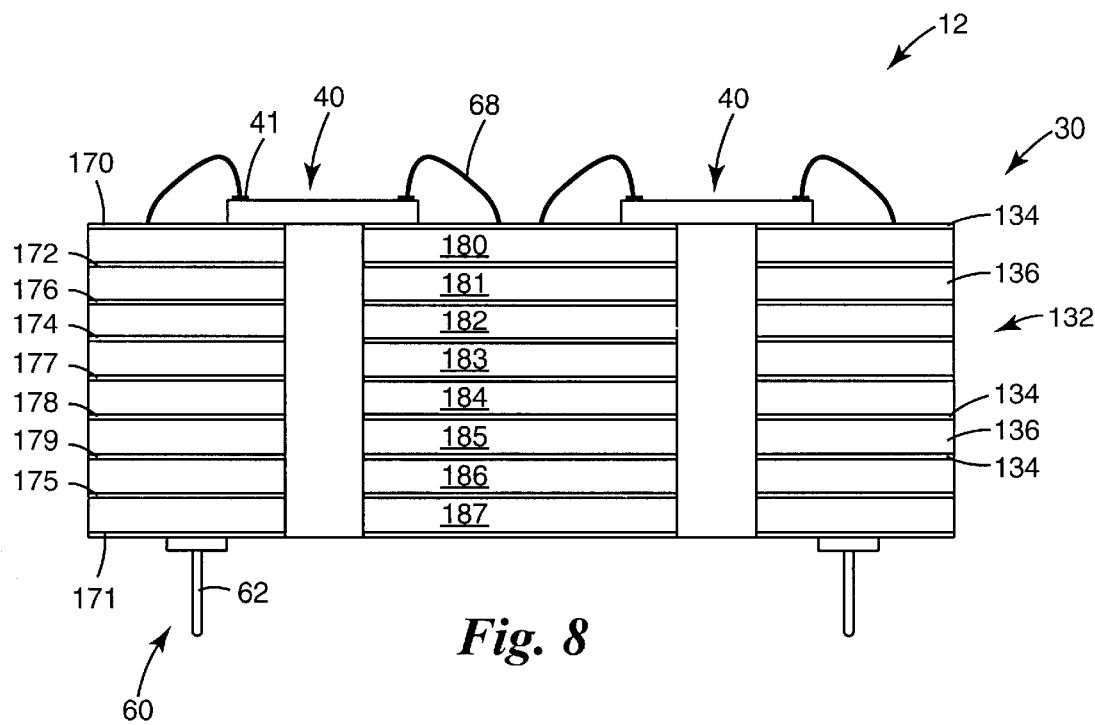
FIG. 8 is a schematic cross-sectional view of another embodiment of a portion of an inkjet printhead assembly according to the present invention.

FIG. 8 illustrates another embodiment of substrate 32. Substrate 132 is formed of multiple planes or layers including a plurality of conductive layers 134 and a plurality of insulative layers 136. Each insulative layer 136 is interposed between two conductive layers 134. Conductive layers 134 include an interface layer 170, an interface layer 171, a power layer 172, a ground layer 174, a ground layer 175, a print data layer 176, a non-print data layer 177, a non-print data layer 178, and a non-print data layer 179. Insulative layers 136 include an insulative layer 180, an insulative layer 181, an insulative layer 182, an insulative layer 183, an insulative layer 184, an insulative layer 185, an insulative layer 186, and an insulative layer 187. The relationship between and function of interface layers 170 and 171, power layer 172, ground layers 174 and 175, print data layer 176, and non-print data layers 177, 178, and 179 are similar to that of interface layers 70 and 71, power layer 72, ground layers 74 and 75, print data layer 76, and non-print data layer 78, respectively, of substrate 32.

In one embodiment, interface layer 170 is provided on a top side of insulative layer 180. As such, interface layer 170 provides an I/O interface for printhead dies 40. Power layer 172 is interposed between insulative layer 180 and insulative layer 181. Print data layer 176 is interposed between insulative layer 181 and insulative layer 182. Ground layer 174 is interposed between insulative layer 182 and insulative layer 183. Non-print data layer 177 is interposed between insulative layer 183 and insulative layer 184. Non-print data layer 178 is interposed between insulative layer 184 and insulative layer 185. Non-print data layer 179 is interposed between insulative layer 185 and insulative layer 186. Ground layer 175 is interposed between insulative layer 186 and insulative layer 187. Interface layer 171 is provided on a bottom side of insulative layer 187. As such, interface layer 171 provides an I/O interface for electronic controller 20. Thus, ground layers 174 and 175 are both interposed between print data layer 176 and interface layer 171. In addition, ground layer 174 is interposed between print data layer 176 and non-print data layers 177, 178, and 179, and ground layer 175 is interposed between non-print data layers 177, 178, and 179, and interface layer 171.

Figure 9:
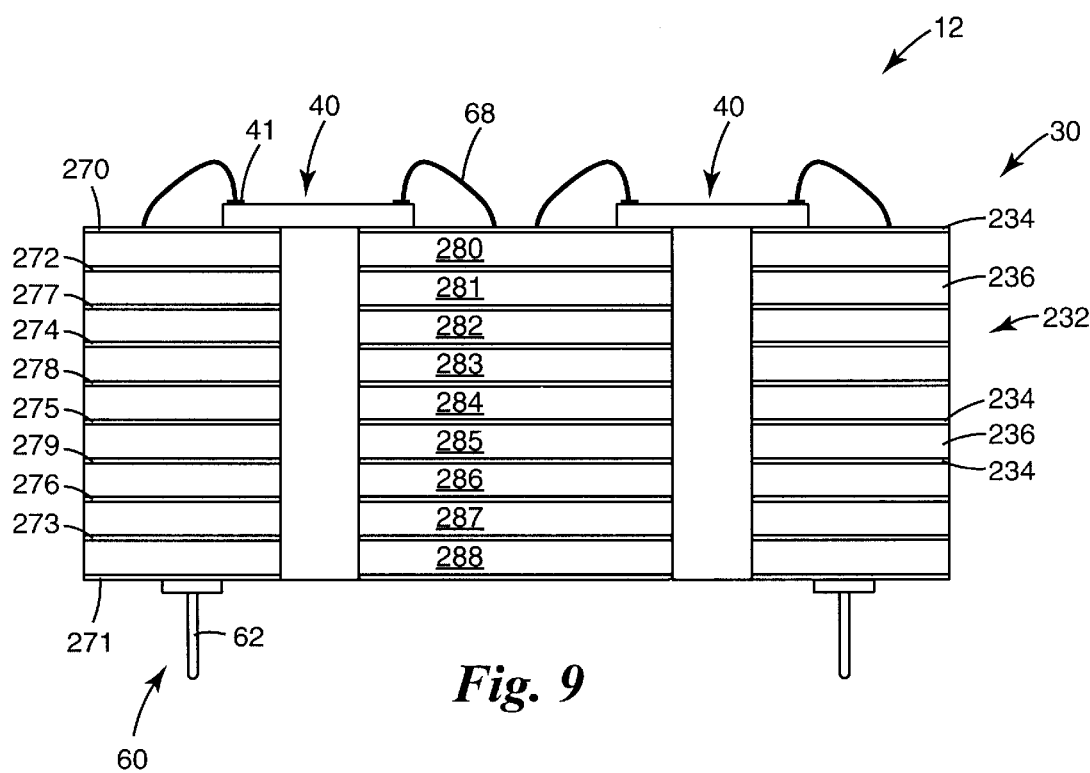
FIG. 9 is a schematic cross-sectional view of another embodiment of a portion of an inkjet printhead assembly according to the present invention.

FIG. 9 illustrates another embodiment of substrate 32. Substrate 232 is formed of multiple planes or layers including a plurality of conductive layers 234 and a plurality of insulative layers 236. Each insulative layer 236 is interposed between two conductive layers 234. Conductive layers 234 include an interface layer 270, an interface layer 271, a power layer 272, a power layer 273, a ground layer 274, a ground layer 275, a ground layer 276, a print data layer 277, a print data layer 278, and a non-print data layer 279. Insulative layers 236 include an insulative layer 280, an insulative layer 281, an insulative layer 282, an insulative layer 283, an insulative layer 284, an insulative layer 285, an insulative layer 286, an insulative layer 287, and an insulative layer 288. The relationship between and function of interface layers 270 and 271, power layers 272 and 273, ground layers 274, 275, and 276, print data layers 277 and 278, and non-print data layer 279 are similar to that of interface layers 70 and 71, power layer 72, ground layers 74 and 75, print data layer 76, and non-print data layer 78, respectively, of substrate 32.

In one embodiment, interface layer 270 is provided on a top side of insulative layer 280. As such, interface layer 270 provides an I/O interface for printhead dies 40. Power layer 272 is interposed between insulative layer 280 and insulative layer 281. Print data layer 277 is interposed between insulative layer 281 and insulative layer 282. Ground layer 274 is interposed between insulative layer 282 and insulative layer 283. Print data layer 278 is interposed between insulative layer 283 and insulative layer 284. Ground layer 275 is interposed between insulative layer 284 and insulative layer 285. Non-print data layer 279 is interposed between insulative layer 285 and insulative 286. Ground layer 276 is interposed between insulative layer 286 and insulative layer 287. Power layer 273 is interposed between insulative layer 287 and insulative layer 288. Interface layer 271 is provided on a bottom side of insulative layer 288. As such, interface layer 271 provides an I/O interface for electronic controller 20. Thus, ground layers 274, 275, and 276 are interposed between print data layer 277 and interface layer 271, and ground layers 275 and 276 are interposed between print data layers 277 and 278 and interface layer 271. In addition, ground layers 274 and 275 are interposed between print data layer 277 and non-print data layer 279, and ground layer 275 is interposed between print data layer 278 and non-print data layer 279. Furthermore, ground layer 276 is interposed between non-print data layer 279 and interface layer 271.

By forming carrier 30 and, more specifically, substrate 32 of multiple layers, power, ground, and data connections between electronic controller 20 and printhead dies 40 are facilitated. More specifically, power, ground, and data lines can be routed on separate planes or layers of substrate 32. By interposing ground layers and/or insulative layers between, for example, print data and non-print data layers, each data layer can be isolated from adjacent layers. Interference or noise between print data and non-print data, therefore, is shielded and/or controlled. Thus, inkjet printhead assembly 12 establishes a three-dimensional, internal electrical routing system which facilitates the routing of power, ground, and data lines between electronic controller 20 and printhead dies 40. In addition, by routing power, ground, and data lines through substrate 32, electrical interfaces which are prone to corrosion and/or ink ingression are eliminated.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An inkjet printhead assembly, comprising:
   a carrier having a first face and a second face and including a plurality of conductive layers, a plurality of conductive vias, and a plurality of insulative layers, the plurality of conductive layers including:
      a first interface layer disposed on the first face of the carrier,
      a second interface layer disposed on the second face of the carrier, and
      at least one power layer, at least one data layer, and at least one ground layer each interposed between the first interface layer and the second interface layer,
   each conductive via providing a conductive path through at least one of the insulative layers to provide electrical coupling between selected ones of the conductive layers; and
   a plurality of printhead dies each mounted on the first face of the carrier, each of the printhead dies electrically coupled to the first interface layer.

2. The inkjet printhead assembly of claim 1, wherein the carrier has a plurality of ink passages extending therethrough, at least one of the ink passages communicating with the first face of the carrier and at least one of the printhead dies.

3. The inkjet printhead assembly of claim 1, wherein each of the insulative layers is interposed between two of the conductive layers.

4. The inkjet printhead assembly of claim 1, wherein at least one of the insulative layers is interposed between the first interface layer and at least one of the at least one power layer, the at least one data layer, and the at least one ground layer.

5. The inkjet printhead assembly of claim 1, wherein at least one of the insulative layers is interposed between the second interface layer and at least one of the at least one power layer, the at least one data layer, and the at least one ground layer.

6. The inkjet printhead assembly of claim 1, wherein the at least one ground layer is interposed between the at least one data layer and the second interface layer.

7. The inkjet printhead assembly of claim 1, wherein the at least one data layer includes at least one print data layer and at least one non-print data layer.

8. The inkjet printhead assembly of claim 7, wherein the at least one ground layer is interposed between the at least one non-print data layer and the second interface layer.

9. The inkjet printhead assembly of claim 7, wherein the at least one ground layer is interposed between the at least one print data layer and the at least one non-print data layer.

10. The inkjet printhead assembly of claim 1, wherein the at least one power layer and the at least one ground layer are disposed in one plane.

11. The inkjet printhead assembly of claim 1, wherein the at least one data layer carries at least one of print data and non-print data.

12. The inkjet printhead assembly of claim 1, wherein the second face of the carrier is opposed to the fir st face of the carrier.

13. The inkjet printhead assembly of claim 1, wherein at least one of the insulative layers comprises a ceramic material.

14. A method of forming an inkjet printhead assembly, the method comprising the steps of:
   providing a plurality of conductive layers including a first interface layer, a second interface layer, at least one power layer, at least one data layer, and at least one ground layer;
   providing a plurality of insulative layers each having a first side and a second side;
   disposing the first interface layer on the first side of a first of the insulative layers and disposing the second interface layer on the second side of a second of the insulative layers;
   interposing the at least one power layer, the at least one data layer, and the at least one ground layer between the first of the interface layers and the second of the interface layers;
   providing a plurality of conductive paths through at least one of the insulative layers to provide electrical coupling between selected ones of the conductive layers; and
   mounting a plurality of printhead dies on and electrically coupling the printhead dies to the first interface layer.

15. The method of claim 14, further comprising the step of:
   forming a plurality of ink passages in at least one of the insulative layers, at least one of the ink passages communicating with the first side of the first of the insulative layers and at least one of the printhead dies.

16. The method of claim 14, wherein the step of interposing the at least one power layer, the at least one data layer, and the at least one ground layer includes interposing each of the at least one power layer, the at least one data layer, and the at least one ground layer between two of the insulative layers.

17. The method of claim 14, further comprising the step of:
   disposing at least one of the at least one power layer, the at least one data layer, and the at least one ground layer on the second side of the first of the insulative layers.

18. The method of claim 14, further comprising the step of:
   disposing at least one of the at least one power layer, the at least one data layer, and the at least one ground layer on the first side of the second of the insulative layers.

19. The method of claim 14, wherein the step of interposing the at least one power layer, the at least one data layer, and the at least one ground layer includes interposing the at least one ground layer between the at least one data layer and the second interface layer.

20. The method of claim 14, wherein the at least one data layer includes at least one print data layer and at least one non-print data layer.

21. The method of claim 20, wherein the step of interposing the at least one power layer, the at least one data layer, and the at least one ground layer includes interposing the at least one ground layer between the at least one non-print data layer and the second interface layer.

22. The method of claim 20, wherein the step of interposing the at least one power layer, the at least one data layer, and the at least one ground layer includes interposing the at least one ground layer between the at least one print data layer and the at least one non-print data layer.

23. The method of claim 14, wherein the step of interposing the at least one power layer, the at least one data layer, and the at least one ground layer includes interposing the at least one power layer and the at least one ground layer in one plane.

24. The method of claim 14, wherein the at least one data layer carries at least one of print data and non-print data.

25. The method of claim 14, wherein the second side of each of the insulative layers is opposed to the first side of each of the insulative layers.

26. The method of claim 14, wherein at least one of the insulative layers comprises a ceramic material.

27. A carrier adapted to receive a plurality of printhead dies, the carrier comprising:
   a first interface adapted for electrical communication with the printhead dies;
   at least one power layer for conducting power;
   at least one data layer for carrying data;
   a second interface;
   a plurality of insulative layers including at least one insulative layer interposed between the at least one power layer and the at least one data layer; and
   a plurality of conductive vias each providing a conductive path through at least one of the insulative layers to provide electrical coupling between selected ones of the first interface, the at least one power layer, the at least one data layer, and the second interface.

28. The carrier of claim 27, wherein at least one of the insulative layers has a plurality of ink openings defined therein, each of the ink openings adapted to provide a passage for ink to a corresponding one of the printhead dies.

29. The carrier of claim 27, further comprising:
   at least one ground layer, wherein at least one insulative layer is interposed between each of the at least one power layer, the at least one data layer, and the at least one ground layer, and wherein the conductive vias provide the conductive path through at least one of the insulative layers to provide electrical coupling between selected ones of the first interface, the at least one power layer, the at least one data layer, the at least one ground layer, and the second interface.

30. The carrier of claim 29, wherein at least one insulative layer is interposed between each of the first interface, the at least one power layer, the at least one data layer, the at least one ground layer, and the second interface.

31. The carrier of claim 29, wherein the at least one power layer and the at least one ground layer are disposed in one plane.

32. The carrier of claim 29, wherein the at least one ground layer is interposed between the at least one data layer and the second interface.

33. The carrier of claim 29, wherein the at least one data layer includes at least one print data layer and at least one non-print data layer.

34. The carrier of claim 33, wherein the at least one ground layer is interposed between the at least one non-print data layer and the second interface.

35. The carrier of claim 33, wherein the at least one ground layer is interposed between the at least one print data layer and the at least one non-print data layer.

36. The carrier of claim 27, wherein at least one insulative layer is interposed between each of the first interface, the at least one power layer, the at least one data layer, and the second interface.

37. The carrier of claim 27, wherein the at least one data layer includes at least one print data layer and at least one non-print data layer.

38. The carrier of claim 27, wherein the at least one data layer carries at least one of print data and non-print data.

39. The carrier of claim 27, wherein at least one of the insulative layers comprises a ceramic material.

40. The carrier of claim 27, wherein the first interface includes an interface layer.

41. The carrier of claim 27, wherein the second interface includes an interface layer.

42. A method of forming a carrier for a plurality of printhead dies, the method comprising the steps of:

providing a first interface adapted for electrical communication with the printhead dies;

providing at least one power layer for conducting power;

providing at least one data layer for carrying data;

providing a second interface;

interposing at least one insulative layer between the at least one power layer and the at least one data layer; and providing a conductive path through the at least one insulative layer to provide electrical coupling between selected ones of the first interface, the at least one power layer, the at least one data layer, and the second interface.

43. The method of claim 42, further comprising the step of:

forming a plurality of ink openings in the at least one insulative layer, each of the ink openings adapted to provide a passage for ink to a corresponding one of the printhead dies.

44. The method of claim 42, further comprising the step of:

providing at least one ground layer, wherein the step of interposing at least one insulative layer includes interposing at least one insulative layer between each of the at least one power layer, the at least one data layer, and the at least one ground layer, and wherein the step of providing the conductive path through the at least one insulative layer includes providing the conductive path through the at least one insulative layer to provide electrical coupling between selected ones of the first interface, the at least one power layer, the at least one data layer, the at least one ground layer, and the second interface.

45. The method of claim 44, wherein the step of interposing at least one insulative layer includes interposing at least one insulative layer between each of the first interface, the at least one power layer, the at least one data layer, the at least one ground layer, and the second interface.

46. The method of claim 44, wherein the at least one power layer and the at least one ground layer are disposed in one plane.

47. The method of claim 44, further comprising the step of:

interposing the at least one ground layer between the at least one data layer and the second interface layer.

48. The method of claim 44, wherein the at least one data layer includes at least one print data layer and at least one non-print data layer.

49. The method of claim 48, further comprising the step of:

interposing the at least one ground layer between the at least one non-print data layer and the second interface layer.

50. The method of claim 48, further comprising the step of:

interposing the at least one ground layer between the at least one print data layer and the at least one non-print data layer.

51. The method of claim 42, wherein the step of interposing at least one insulative layer includes interposing at least one insulative layer between each of the first interface, the at least one power layer, the at least one data layer, and the second interface.

52. The method of claim 42, wherein the at least one data layer includes at least one print data layer and at least one non-print data layer.

53. The method of claim 42, wherein the at least one data layer carries at least one of print data and non-print data.

54. The method of claim 42, wherein the at least one insulative layer comprises a ceramic material.

55. The method of claim 42, wherein the first interface includes an interface layer.

56. The method of claim 42, wherein the second interface includes an interface layer.

* * * * *